(12) United States Patent
Hati et al.

(10) Patent No.: US 10,565,330 B2
(45) Date of Patent: Feb. 18, 2020

(54) SYSTEM AND METHOD OF VEHICLE TELEMATICS SIMULATION AND TESTING

(71) Applicant: WIPRO LIMITED, Bangalore (IN)

(72) Inventors: Amitesh Hati, Hooghly (IN); Shantanu Das, Kolkata (IN); Amitava Mudi, Kolkata (IN)

(73) Assignee: Wipro Limited, Bangalore (IN)

( * ) Notice: Subject to any disclaimer, the term of this patent is extended or adjusted under 35 U.S.C. 154(b) by 316 days.

(21) Appl. No.: 15/463,427

(22) Filed: Mar. 20, 2017

(65) Prior Publication Data
US 2018/0260500 A1    Sep. 13, 2018

(30) Foreign Application Priority Data
Mar. 7, 2017   (IN) .............................. 201741007888

(51) Int. Cl.
*G06F 17/50*    (2006.01)

(52) U.S. Cl.
CPC .............................. *G06F 17/5009* (2013.01)

(58) Field of Classification Search
CPC ....... G06F 17/5009; H04W 4/70; H04W 4/90; H04W 4/40; G07C 5/008; H04L 41/145; H04L 43/0847; H04L 43/50; H04L 43/045
USPC .......................................................... 703/8
See application file for complete search history.

(56) References Cited

U.S. PATENT DOCUMENTS

2016/0283361 A1*  9/2016  Alexander .......... G06F 11/3688
2017/0178419 A1*  6/2017  Paridel ................ G06F 17/5009

OTHER PUBLICATIONS

Irwin_2007 (Automatic Collision Notification and Vehicl Telematics Technical Information Document (TID) NENA 07-504, Jun. 1, 2007). (Year: 2007).*
Singh_2014 (Singh et al. EURASIP Journal on Wireless Communications and Networking 2014, 2014:49 http://jwcn.eurasipjournals.com/content/2014/1/49) (Year: 2014).*
DGE, Inc., "Telematics System Tester", http://www.lev.com/fileadmin/user_upload/DGE/Data_Sheets/DGE_Telematics_System_Tester.pdf, 2 pages (2012).
"Car Hacker's Handbook", http://opengarages.org/index.php/MCD_software, 11 pages (Feb. 9, 2017).

* cited by examiner

*Primary Examiner* — Brian S Cook
(74) *Attorney, Agent, or Firm* — Finnegan, Henderson, Farabow, Garrett & Dunner, LLP

(57) ABSTRACT

Disclosed herein are a system and method for vehicle telematics testing. The method includes receiving, by a vehicle telematics simulator, a vehicle incident data from a vehicle control unit based on one or more test cases and simulating a physical radio network for transmission of the vehicle incident data. The method includes forwarding the simulated transmission of the vehicle incident data to a telematics server, and receiving an emergency response data from the telematics server, in response to the forwarded simulated transmission of the vehicle incident data. Detecting at least one transmission error in at least one of the simulated transmission of the vehicle incident data to the telematics server and the receipt of the emergency response and displaying the at least one transmission error.

12 Claims, 4 Drawing Sheets ary only, with
SYSTEM AND METHOD OF VEHICLE TELEMATICS SIMULATION AND TESTING

TECHNICAL FIELD

This disclosure relates to telematics system, and more particularly to a system and method of vehicle telematics simulation and testing.

BACKGROUND

There has been great developments in the field of communications technology, and especially in the domain of telematics. Telematics may be an interdisciplinary subject covering telecommunications, vehicular technology, road transportation road safety etc.

Vehicular telematics is a field of significant importance, where related operation of the vehicle can be automatically reported from the vehicle to a control module that monitors a fleet of vehicles for various purposes such as vehicle diagnostics or tracking deliveries. Validation of the vehicle telematics system requires hardware and software components for testing the overall working, upgrades, and efficiency of the vehicle telematics system.

Conventional testing of the various vehicle telematics systems requires expensive hardware and software components which increases the cost. Also, the same or generic vehicle telematics systems is deployed in various jurisdictions having diverse conditions including different regulatory compliance related issues. In an example, different countries have different requirements for mobile communications. In Australia, the VoLTE calls are made on 850 MHz, while in India most of the devices run on 1800 MHz (Band 3) or 2300 Mhz (Band 40). Hence different devices need to tested in different conditions.

SUMMARY

In one embodiment, a method for data cleansing is described. The method includes simulating by a vehicle telematics simulation controller, a physical radio network for transmission of a vehicle incident data, wherein the vehicle incident data is based on one or more test cases, wherein the physical radio network comprises at least one of a software defined radio and a simulated base station. The method includes forwarding the simulated transmission of the vehicle incident data to a telematics server, and receiving an emergency response data from the telematics server, in response to the forwarded simulated transmission of the vehicle incident data. Detecting at least one transmission error in at least one of the simulated transmission of the vehicle incident data to the telematics server and detecting the corresponding indication from vehicle control unit and displaying the at least one transmission error.

In another embodiment, a vehicle telematics simulation controller is disclosed. The vehicle telematics simulator includes at least one processor and a memory. The memory stores instructions that, when executed by the at least one processor, causes the at least one processor to perform operations including, simulating a physical radio network for transmission of a vehicle incident data, wherein the vehicle incident data is based on one or more test cases, wherein the physical radio network comprises at least one of a software defined radio and a simulated base station. The operation includes forwarding the simulated transmission of the vehicle incident data to a telematics server, and receiving an emergency response data from the telematics server, in response to the forwarded simulated transmission of the vehicle incident data. The operations further include detecting at least one transmission error in at least one of the simulated transmission of the vehicle incident data to the telematics server and detecting the corresponding indication from vehicle control unit. Finally, the operations include displaying the at least one transmission error.

In another embodiment, a non-transitory computer-readable storage medium for assistive photography is disclosed, which when executed by a computing device, cause the computing device to perform operations including, simulating a physical radio network for transmission of a vehicle incident data, wherein the vehicle incident data is based on one or more test cases, wherein the physical radio network comprises at least one of a software defined radio and a simulated base station. The operation includes forwarding the simulated transmission of the vehicle incident data to a telematics server, and receiving an emergency response data from the telematics server, in response to the forwarded simulated transmission of the vehicle incident data. The operations further include detecting at least one transmission error in at least one of the simulated transmission of the vehicle incident data to the telematics server and detecting the corresponding indication from vehicle control unit. Finally, the operations include displaying the at least one transmission error.

BRIEF DESCRIPTION OF THE DRAWINGS

The accompanying drawings, which are incorporated in and constitute a part of this disclosure, illustrate exemplary embodiments, and together with the description, serves to explain the disclosed principles.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Embodiments of the present disclosure provide a system and method of vehicle telematics simulation and testing. The present subject matter receives vehicle incident data from a vehicle control unit based on one or more test cases. The vehicle control unit may be a device installed in a vehicle and capable of collecting relevant data about the vehicle including vehicle movement, location, fuel, damage, accident etc. Subsequently, a physical radio network for transmission of the vehicle incident data may be simulated, wherein the physical radio network comprises at least one of a software defined radio and a simulated base station. After the simulation, the simulated vehicle incident data may be transmitted to a telematic server. In response to the transmitted incident data, an emergency response data may be received, and at least one transmission error may be detected in at least one of the simulated transmission of the vehicle incident data to the telematics server and detecting the corresponding indication from vehicle control unit. In an example, the set of pre-defined conditions may include antenna power threshold, bandwidth threshold, data loss or lag in the communication network and may also include other thresholds set by local regulatory authorities. Finally, displaying the at least one transmission error.

Figure 1:
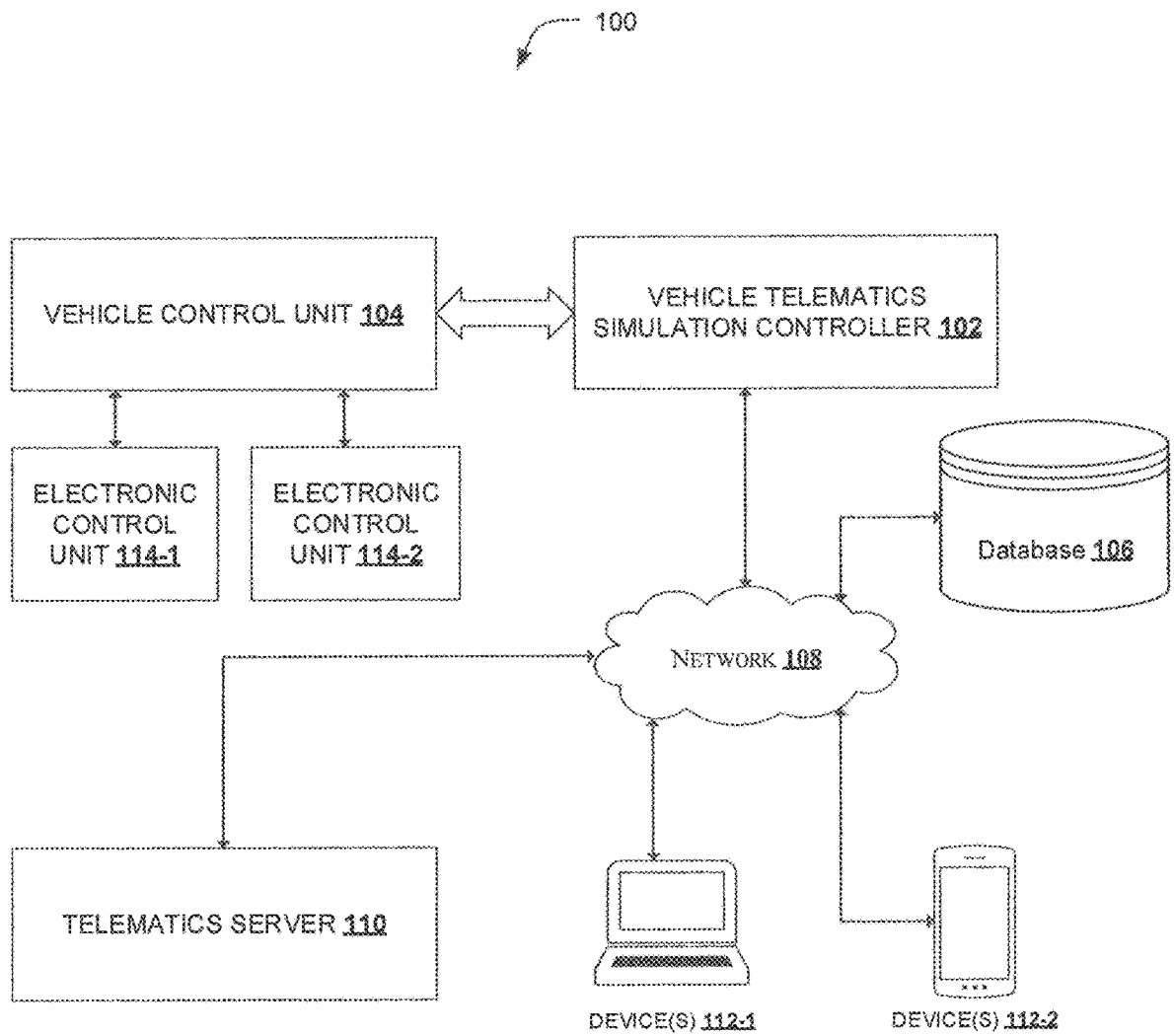
FIG. 1 illustrates an exemplary network implementation for simulating and testing a vehicle telematics system, in accordance with some embodiments of the present subject matter.

FIG. 1 illustrates an exemplary network implementation for simulating and testing a vehicle telematics system, in accordance with some embodiments of the present subject matter.

Referring to FIG. 1, an exemplary system 100 comprising one or more components configured for simulating and testing a vehicle telematics is disclosed. The one or more components may include a plurality of Electronic Control Units (ECU) 114-1, and 114-2, collectively and individually referred to as ECU 114, a vehicle telematics simulation controller (VTSC) 102, and a database 106. The above mentioned one or more components are communicatively coupled to each other.

The VCU 104 may receive vehicle data from ECU 114, via the vehicle network. In an example, the vehicle network may use CAN protocol or optionally Media Oriented Systems Transport (MOST), FlexRay or Local Interconnect Network (LIN) protocols. In an example, ECU 114, may be a vehicle fuel level detector, speed detector, vehicle location detector, vehicle temperature detector etc. In an example, the ECU 114 may send vehicle fuel level data to the VCU 104 at regular intervals. In another example, the ECU 114 may detect low level of fuel in the vehicle, and send the same to the VCU 114. In a further example, the ECU 114 may detect location of the vehicle along with low level of fuel and transmit the data to the VCU 104 via the vehicle network.

In some embodiments, the VTSC 102 may be communicatively coupled with the VCU 104. In an example, The VTSC 102 may communicate with the VCU 104 through a Controller Area Network (CAN) or serial interface to provide a 360 degree test coverage. In some embodiments, the VTSC 102 and the database 106 may be communicatively coupled to a telematic server 110 and a plurality of devices 112-1 and 112-2, collectively and individually referred to as the devices 112 using a communication network 108.

The network 108, may be a wireless network, wired network or a combination thereof. The network 108, may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The network 108 may include, without limitation, a direct interconnection, local area network (LAN), wide area network (WAN), wireless network (e.g., using Wireless Application Protocol), the Internet, etc. In some embodiments, using the network 108, the VTSC 102 may communicate with the database 106, the telematics server 110 and the devices 112.

In some embodiments, the database 106 may be a local database present locally within the VTSC 102. In some embodiments, the database 106 may include a set of pre-defined conditions. The set of predefined conditions may be threshold values set by users for different errors which may arise in the communication of the data through the network. The predefined conditions may also be based on the regulatory requirements set by the local authorities.

The devices 112 may include, without limitation, personal computer(s), server(s), fax machines, printers, scanners, various mobile devices such as cellular telephones, smartphones (e.g., Apple iPhone, Blackberry. Android-based phones, etc.), tablet computers, eBook readers (Amazon Kindle, Nook, etc.), laptop computers, notebooks, gaming consoles (Microsoft Xbox, Nintendo DS, Sony PlayStation, etc.), or the like. In some embodiments, the VTSC 102 may itself embody one or more of these devices.

The VTSC 102 may receive data from the VCU 104 and may simulate a physical radio frequency (RF) network and may also detect error in the communication.

Figure 2:
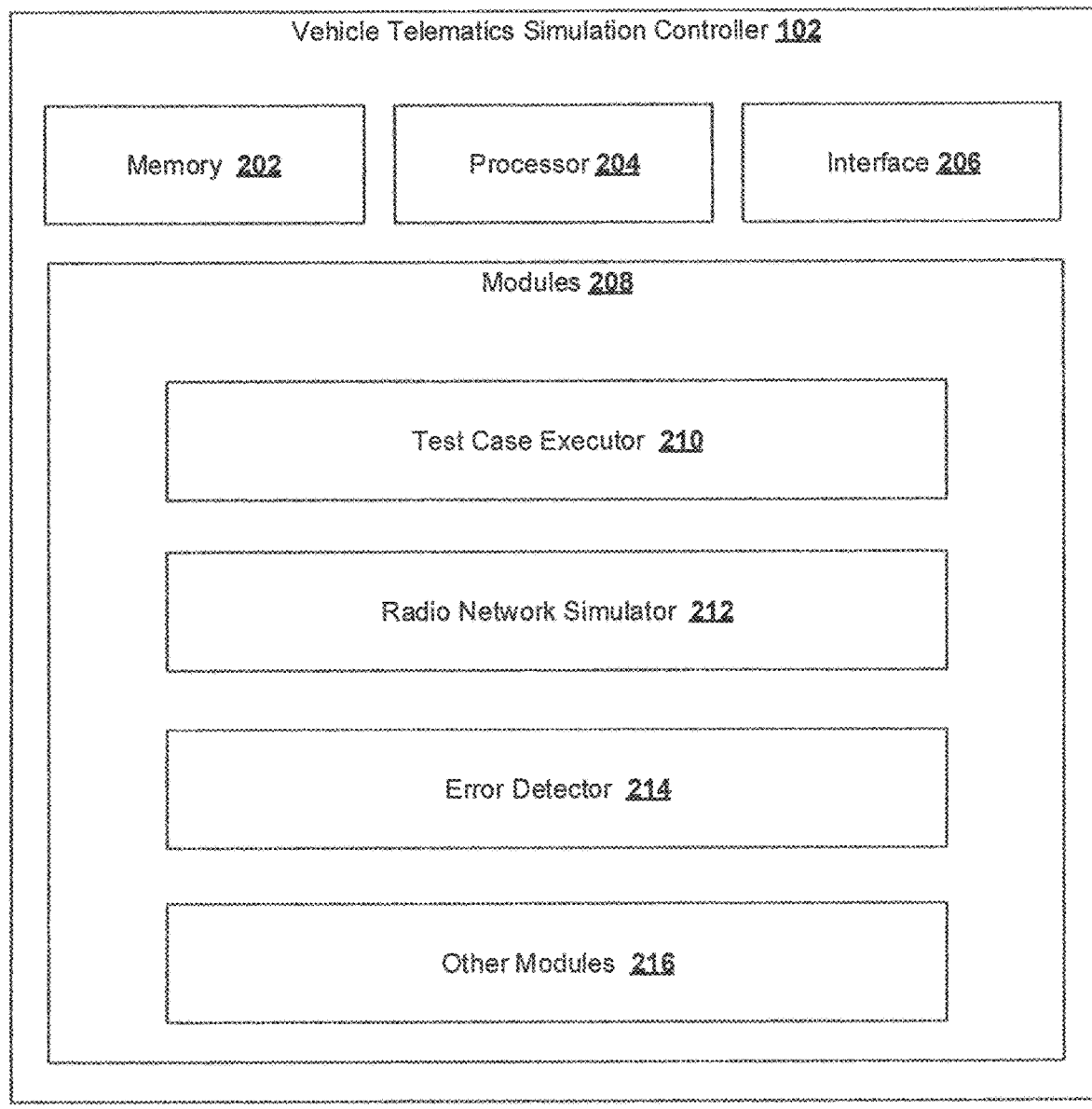
FIG. 2 illustrates a vehicle telematics simulation controller for simulating and testing a vehicle telematics system, in accordance with some embodiments of the present subject matter.

The VTSC 102 for simulating and testing vehicle telematics is explained in more detail in conjunction with FIG. 2. As shown in FIG. 2, the VTSC 102, comprises of a processor 204, a memory 202 coupled to the processor 204, and interface(s) 206. The processor 204 may be implemented as one or more microprocessors, microcomputers, microcontrollers, digital signal processors, central processing units, state machines, logic circuitries, and/or any devices that manipulate signals based on operational instructions. Among other capabilities, the processor 204 is configured to fetch and execute computer-readable instructions stored in the memory 202. The memory 202 can include any non-transitory computer-readable medium known in the art including, for example, volatile memory (e.g., RAM), and/or non-volatile memory (e.g., EPROM, flash memory, etc.).

The interface(s) 206 may include a variety of software and hardware interfaces, for example, a web interface, a graphical user interface, etc., allowing the VTSC 102 to interact with the VCU 104 and in some embodiments also with the telematics server 110 and the devices 112. Further, the interface(s) 206 may enable the VTSC 102 respectively to communicate with other computing devices. The interface(s) 206 can facilitate multiple communications within a wide variety of networks and protocol types (Peripheral Component Interconnect (PCI), Universal Serial Bus (USB) etc), including wired networks, for example LAN, cable, etc., and wireless networks such as WLAN, cellular, or satellite. The interface(s) 206 may include one or more ports for connecting a number of devices to each other or to another server.

In some embodiments, a software defined radio (SDR) may be used in the interface(s) 206 for generating specific radio signals. The interface(s) 206 comprising a software defined radio include transmitter and receiver channels with required network bandwidth support for voice and data calls. In some embodiments, a GNU Radio may be used, which may provide basic signal processing blocks that may be exploited to implement a SDR that provides usage of multi-antenna transmitters and receivers for transmitting/receiving the RF signal for the vehicle control unit.

In one embodiment, the VTSC 102 includes modules 208. In one embodiment, the modules 208 may be stored within the memory 206. In one example, the modules 208, amongst other things, include routines, programs, objects, components, and data structures, which perform particular tasks or implement particular abstract data types. The modules 208 may also be implemented as, signal processor(s), state machine(s), logic circuitries, and/or any other device or component that manipulate signals based on operational instructions. Further, the modules 208 can be implemented by one or more hardware components, by computer-readable instructions executed by a processing unit, or by a combination thereof.

In one implementation, the modules 208 further include a test case executor (TCE) 210, a radio network simulator (RNS) 212, and an error detector 214. In an example, the modules 208 may also comprise other modules 216. The other modules 216 may perform various miscellaneous functionalities of the VTSC 102. It will be appreciated that such afore mentioned modules may be represented as a single module or a combination of different modules.

In operations, the TCE 210 may create and execute one or more test cases. In an example, the test cases may include the set of predefined conditions. In an example, the test cases may be related to various conditions for which the VCU 104 may be tested. In an example, the TCE 210 may simulate a test case relating to a fire in a car. The test case of fire in a car may be a simulated input to the VCU 104. In a further example, the test cases may be generated confirming to various regulatory norms of the local authorities of specific jurisdictions, and also in terms of local geographical conditions. In an example, the VTSC 102 may have to be tested for Australian conditions in LTE domain, and hence the conditions for the test cases may be that VoLTE calls to be used in the 850 MHz frequency range. In some embodiments, the test cases may be input by a user, or the VTSC 102 may also generate the test cases in sequential manner.

The simulated test case may then be detected by one of the ECU 114. The ECU 114, may then transmit the simulated test case in the form of vehicle incident data to the VCU 104 through the vehicle network. In an example, the vehicle incident data may be correspondingly similar to the vehicle catching fire. The vehicle incident data may then be transmitted to the VTSC 102 by the VCU 104. In some embodiments, the VCU 104, may further transmit vehicle location data and other critical data that may be necessary for appropriate action to be determined by the telematics server 110.

The vehicle incident data may be received by the software defined radio (SDR) in the interface(s) 206. In some embodiments, SDR hardware interface simulates the physical radio frequency signal of the VCU 104 and it may be provided to a GNU Radio or equivalent that implements the SDR.

The RNS 212 further receives the simulated vehicle incident data through the interface(s) 206 from the VCU 104. In some embodiments, the RNS 212 may simulate a base station, coupled with the software defined radio. In an example, the base station simulation may be responsible for the allocation of radio resources to a mobile call and for the handovers that are made between base stations under its control. In another example, the base station simulation may also be responsible for handling traffic and signaling between a mobile phone and the network switching subsystem. Hence the RNS 212 by simulating the base station may be responsible for data transmission, load balancing, resource allocation etc. between the telematics server 110 and the devices 112.

In some embodiments, the vehicle incident data may be transmitted to the telematics server 110. The telematics server 110 upon receiving the vehicle incident data may further determine an appropriate emergency response. In an example, the emergency response may be calling the nearest fire station providing the location of the vehicle in response to a vehicle incident data of fire. In another example, the telematics server 110 may determine that contacting an ambulance, or emergency contacts or the police or 911 in case of an accident or airbag deployment related vehicle incident data may be the appropriate emergency response.

The error detector 214 may receive the emergency response data from the telematics server 110. In some embodiments, the error detector 214 may detect at least one transmission error in at least one of the simulated transmission of the vehicle incident data to the telematics server and the receipt of the emergency response data based on the set of predefined conditions retrieved from the database 106.

In an example, an error may be that when an emergency call is going on and the call gets dropped. The call may be established again by retrying based on preconditions/business logic. VTSC 102 can validate either via communication channel between VTSC 102 and VCU 104 or by checking call status after redial is successful.

The error detector 214 may further display the at least one transmission error, for further action. In some embodiments, the further action may be performed by the user.

In some embodiments, the VTSC 102 may transmit the emergency response data received from the telematics server 110 to the VCU 104 via the software defined radio hardware interface in the interface(s) 206. In response to the emergency response data, the VCU 104 may generate an emergency action. In some embodiments, the VCU 104, may be configured to utilize packet data connection, voice call, Short Message Service (SMS) or geo-location information for implementing services such as, vehicle tracking, route assistance and emergency call, roadside assistance, emergency assistance, automatic collision notification, vehicle diagnostics, navigation and air bag inflation. The emergency action may be to act on the emergency response, like calling intimidating the police, fire station, ambulance etc. In an example, the emergency action data may be to call a fire station and send location to the ambulance services using SMS.

The emergency action in the form of emergency action data may be received by the VTSC 102 via the software defined radio embedded with the interface(s) 206. Upon receiving the emergency action data, the RNS 212 may simulate a receiver for the emergency action data, wherein the simulation of the receiver is performed by the simulated base station.

In some embodiments, instead of simulating the receiver, the VTSC 102 may forward the emergency action data to the devices 112.

In some embodiments, the error report may be due to non-conformance of the transmission with regulatory policies of a particular jurisdiction.

Figure 3:
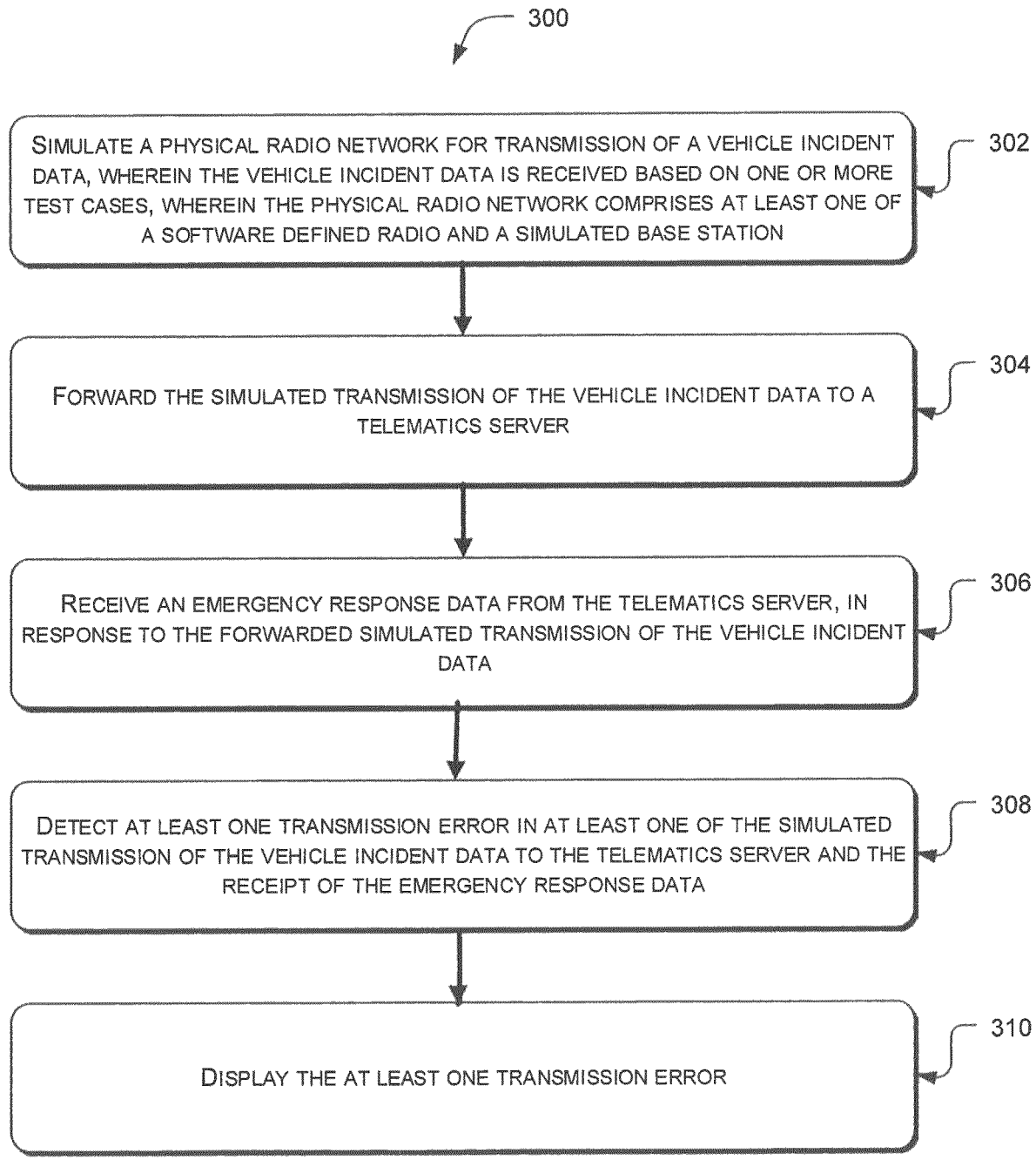
FIG. 3 illustrates an exemplary method for simulating and testing a vehicle telematics system, in accordance with some embodiments of the present subject matter.

FIG. 3 illustrates an exemplary method for vehicle telematics simulation and testing with some embodiments of the present disclosure.

The method 300 may be described in the general context of computer executable instructions. Generally, computer executable instructions can include routines, programs, objects, components, data structures, procedures, modules, and functions, which perform particular functions or implement particular abstract data types. The method 300 may also be practiced in a distributed computing environment where functions are performed by remote processing devices that are linked through a communication network. In a distributed computing environment, computer executable instructions may be located in both local and remote computer storage media, including memory storage devices.

Reference is made to FIG. 3, the order in which the method 300 is described is not intended to be construed as a limitation, and any number of the described method blocks can be combined in any order to implement the method 300 or alternative methods. Additionally, individual blocks may be deleted from the method 300 without departing from the spirit and scope of the subject matter described herein. Furthermore, the method 300 can be implemented in any suitable hardware, software, firmware, or combination thereof.

With reference to FIG. 3, at step 302, a physical radio network may be simulated for transmission of a vehicle incident data, wherein the vehicle incident data is received based on one or more test cases, wherein the physical radio network comprises at least one of a software defined radio and a simulated base station.

In an example, the one or more test cases may be an airbag deployment signal to the VCU 104. In some embodiments, the TCE 210 may, execute and transmit test cases to the VCU 104.

In some embodiments, the test cases may comprise a set of predefined conditions. In an example, the set of predefined conditions may be certain regulatory conditions of certain specific jurisdiction.

In some embodiments, the vehicle incident data may be received by the VTSC 102 through a software defined radio (SDR) hardware interface within the interface(s) 206. The SDR may use a GNU radio to simulate physical radio frequency signal.

After the simulation, at step 304, the simulated transmission of the vehicle incident data may be forwarded to a telematics server 110. In an example, the telematics server 110 may provide emergency support contact and determine an appropriate emergency response based on the vehicle incident data.

The VTSC 102 may receive the emergency response data from the telematics server at step 306.

Upon receiving the emergency response data, at step 308 at least one transmission error in at least one of the simulated transmission of the vehicle incident data to the telematics server and the receipt of the emergency response data may be detected based on a set of predefined conditions.

At step 310, the at least one transmission error may be displayed for further action.

In some embodiments, the emergency response data may be transmitted to the VCU 104. An emergency action data from the VCU 104 may then be received by the VTSC 102 in response to the transmitted emergency response data. Finally, a receiver for the emergency action data, may be simulated by the VTSC 104, wherein the simulation of the receiver is performed by the simulated base station in the RNS 212.

In some other embodiments, an error report may be generated by the error detector 214, based on transmission faults in at least one of the transmission of the emergency response to the vehicle control unit, the receipt of the emergency action data from the at least one external server or the simulation of the receiver.

A few advantages of the present disclosure may include automation and complete control of a network simulator for vehicle telematics testing. Further the disclosure ensures validation/testing of any new vehicle telematics product with in-house network simulator. It enables simulation of any network for testing 3G/4G voice and data calls with a requirement for mobile network and bands, cell switching etc. Further the disclosure provides total control over network error condition generation.

Computer System

Figure 4:
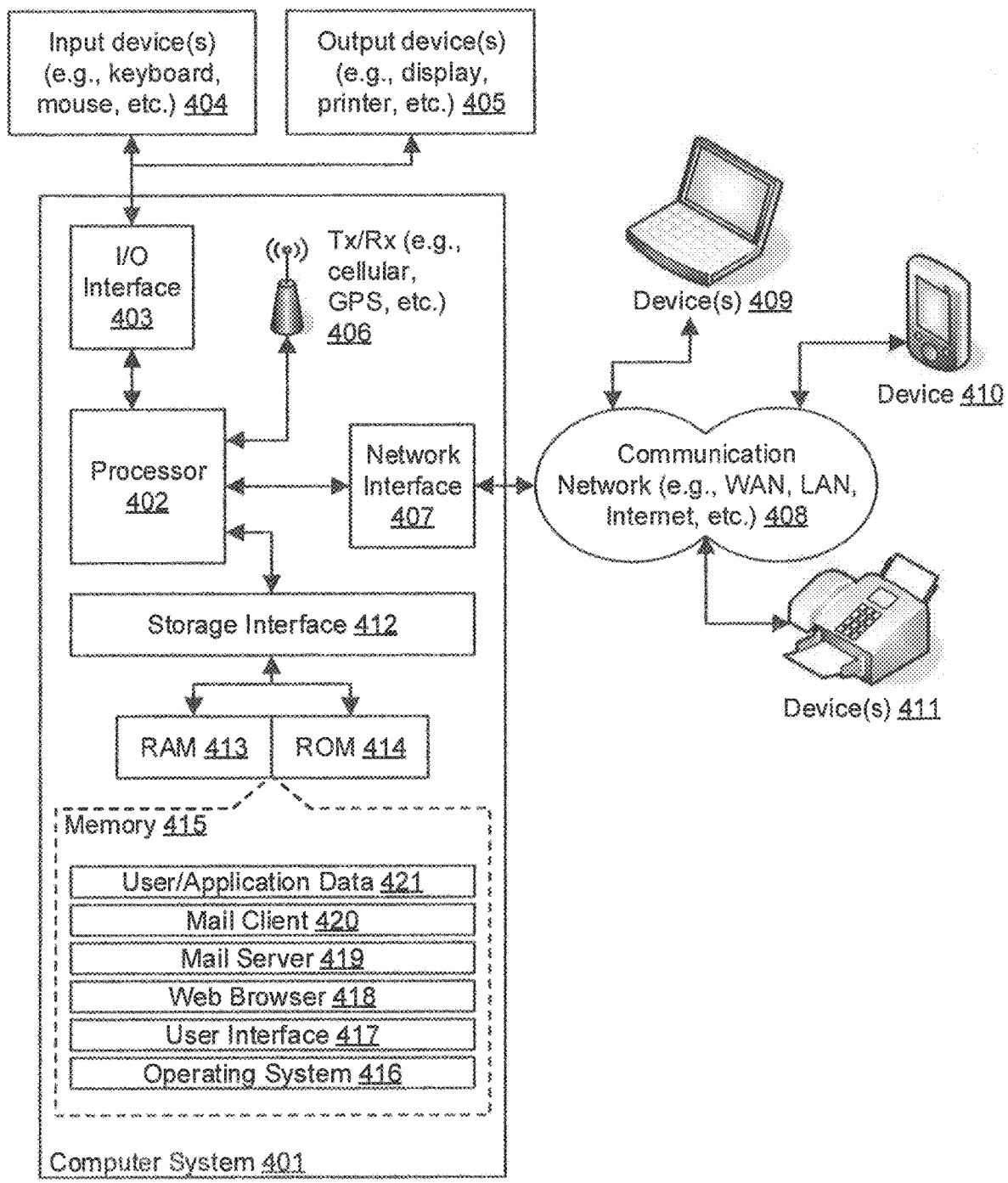
FIG. 4 is a block diagram of an exemplary computer system for implementing embodiments consistent with the present disclosure.

FIG. 4 is a block diagram of an exemplary computer system for implementing embodiments consistent with the present disclosure. Variations of computer system 401 may be used for implementing the devices and systems disclosed herein. Computer system 401 may comprise a central processing unit ("CPU" or "processor") 402. Processor 402 may comprise at least one data processor for executing program components for executing user- or system-generated requests. A user may include a person, a person using a device such as those included in this disclosure, or such a device itself. The processor may include specialized processing units such as integrated system (bus) controllers, memory management control units, floating point units, graphics processing units, digital signal processing units, etc. The processor may include a microprocessor, such as AMD Athlon, Duron or Opteron, ARM's application, embedded or secure processors, IBM PowerPC, Intel's Core, Itanium, Xeon, Celeron or other line of processors, etc. The processor 302 may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

Processor 402 may be disposed in communication with one or more input/output (I/O) devices via I/O interface 403. The I/O interface 403 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.11a/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using the I/O interface 403, the computer system 401 may communicate with one or more I/O devices. For example, the input device 404 may be an antenna, keyboard, mouse, joystick, (infrared) remote control, camera, card reader, fax machine, dongle, biometric reader, microphone, touch screen, touchpad, trackball, sensor (e.g., accelerometer, light sensor, GPS, gyroscope, proximity sensor, or the like), stylus, scanner, storage device, transceiver, video device/source, visors, etc. Output device 405 may be a printer, fax machine, video display (e.g., cathode ray tube (CRT), liquid crystal display (LCD), light-emitting diode (LED), plasma, or the like), audio speaker, etc. In some embodiments, a transceiver 806 may be disposed in connection with the processor 402. The transceiver may facilitate various types of wireless transmission or reception. For example, the transceiver may include an antenna operatively connected to a transceiver chip (e.g., Texas Instruments WiLink WL1283, Broadcom BCM47501UB8, Infineon Technologies X-Gold 618-PMB9800, or the like), providing IEEE 802.11a/b/g/n, Bluetooth, FM, global positioning system (GPS), 2G/3G HSDPA/HSUPA communications, etc.

In some embodiments, the processor 402 may be disposed in communication with a communication network 408 via a network interface 407. The network interface 407 may communicate with the communication network 408. The network interface may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The communication network 408 may include, without limitation, a direct interconnection, local area network (LAN), wide area network (WAN), wireless network (e.g., using Wireless Application Protocol), the Internet, etc. Using the network interface 407 and the communication network 408, the computer system 401 may communicate with devices 410, 411, and 412. These devices may include, without limitation, personal computer(s), server(s), fax machines, printers, scanners, various mobile devices such as cellular telephones, smartphones (e.g., Apple iPhone, Blackberry, Android-based phones, etc.), tablet computers, eBook readers (Amazon Kindle, Nook, etc.), laptop computers, notebooks, gaming consoles (Microsoft Xbox, Nintendo DS, Sony PlayStation, etc.), or the like. In some embodiments, the computer system 401 may itself embody one or more of these devices.

In some embodiments, the processor 402 may be disposed in communication with one or more memory devices (e.g., RAM 413, ROM 414, etc.) via a storage interface 412. The storage interface may connect to memory devices including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc. Variations of memory devices may be used for implementing, for example, the databases disclosed herein.

The memory devices may store a collection of program or database components, including, without limitation, an operating system 416, user interface application 417, web browser 418, mail server 416, mail client 420, user/application data 421 (e.g., any data variables or data records discussed in this disclosure), etc. The operating system 416 may facilitate resource management and operation of the computer system 401. Examples of operating systems include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like. User interface 417 may facilitate display, execution, interaction, manipulation, or operation of program components through textual or graphical facilities. For example, user interfaces may provide computer interaction interface elements on a display system operatively connected to the computer system 401, such as cursors, icons, check boxes, menus, scrollers, windows, widgets, etc. Graphical user interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, Javascript, AJAX, HTML, Adobe Flash, etc.), or the like.

In some embodiments, the computer system 401 may implement a web browser 418 stored program component. The web browser may be a hypertext viewing application, such as Microsoft Internet Explorer, Google Chrome, Mozilla Firefox, Apple Safari, etc. Secure web browsing may be provided using HTTPS (secure hypertext transport protocol), secure sockets layer (SSL), Transport Layer Security (TLS), etc. Web browsers may utilize facilities such as AJAX, DHTML, Adobe Flash, JavaScript, Java, application programming interfaces (APIs), etc. In some embodiments, the computer system 401 may implement a mail server 419 stored program component. The mail server may be an Internet mail server such as Microsoft Exchange, or the like. The mail server may utilize facilities such as ASP, ActiveX, ANSI C++/C#, Microsoft .NET, CGI scripts, Java, JavaScript, PERL, PHP, Python, WebObjects, etc. The mail server may utilize communication protocols such as internet message access protocol (IMAP), messaging application programming interface (MAPI), Microsoft Exchange, post office protocol (POP), simple mail transfer protocol (SMTP), or the like. In some embodiments, the computer system 401 may implement a mail client 420 stored program component. The mail client may be a mail viewing application, such as Apple Mail, Microsoft Entourage, Microsoft Outlook, Mozilla Thunderbird, etc.

In some embodiments, computer system 401 may store user/application data 421, such as the data, variables, records, etc. as described in this disclosure. Such databases may be implemented as fault-tolerant, relational, scalable, secure databases such as Oracle or Sybase. Alternatively, such databases may be implemented using standardized data structures, such as an array, hash, linked list, struct, structured text file (e.g., XML), table, or as object-oriented databases (e.g., using ObjectStore, Poet, Zope, etc.). Such databases may be consolidated or distributed, sometimes among the various computer systems discussed above in this disclosure. It is to be understood that the structure and operation of any computer or database component may be combined, consolidated, or distributed in any working combination.

The specification has described a system and method for vehicle telematics simulation and testing. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory.

Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

We claim:

1. A method of vehicle telematics testing, the method comprising:
   simulating, by a vehicle telematics simulation controller, a physical radio network for transmission of a vehicle incident data, wherein the vehicle incident data is received based on one or more test cases, wherein the physical radio network comprises at least one of a software defined radio and a simulated base station, and wherein the one or more test cases are generated in conformance with regulatory norms of local authorities of a jurisdiction;
   forwarding, by the vehicle telematics simulation controller, the simulated transmission of the vehicle incident data to a telematics server;
   receiving, by the vehicle telematics simulation controller, an emergency response data from the telematics server, in response to the forwarded simulated transmission of the vehicle incident data;
   transmitting, by the vehicle telematics simulation controller, the emergency response data to a vehicle control unit;
   receiving, by the vehicle telematics simulation controller, an emergency action data from the vehicle control unit in response to the transmitted emergency response data;
   simulating, by the vehicle telematics simulation controller, a receiver for the emergency action data, wherein the simulation of the receiver is performed by the simulated base station;
   detecting, by the vehicle telematics simulation controller, at least one transmission error associated with receipt of the emergency action data with respect to the simulation of the receiver and the at least one transmission error in at least one of the simulated transmission of the vehicle incident data to the telematics server and the receipt of the emergency response data, wherein the at least one transmission error comprises call drop, signal error, and non-conformance, of the simulated transmission of the vehicle incident data to the telematics server, of the receipt of the emergency response data, and of the receipt of the emergency action data with respect to the simulation of the receiver, with the regulatory norms of local authorities of a jurisdiction; and
   displaying, by the vehicle telematics simulation controller, the at least one transmission error.

2. The method of claim 1, further comprising generating an error report based on transmission faults in at least one of the transmission of the emergency response data to the vehicle control unit, the receipt of the emergency action data from the at least one external server or the simulation of the receiver.

3. The method of claim 1, wherein the one or more test cases comprise one or more predefined conditions.

4. The method of claim 1, wherein the software defined radio comprises a hardware interface comprising a GNU radio for simulating a physical radio frequency signal based on the vehicle incident data.

5. A vehicle telematics simulation controller, comprising:
   a hardware processor;
   a memory storing instructions executable by the hardware processor for:
      simulating a physical radio network for transmission of a vehicle incident data, wherein the vehicle incident data is received based on one or more test cases, wherein the physical radio network comprises at least one of a software defined radio and a simulated base station, and wherein the one or more test cases are generated in conformance with regulatory norms of local authorities of a jurisdiction;
      forwarding the simulated transmission of the vehicle incident data to a telematics server;
      receiving an emergency response data from the telematics server, in response to the forwarded simulated transmission of the vehicle incident data;
      transmitting the emergency response data to a vehicle control unit;
      receiving an emergency action data from the vehicle control unit in response to the transmitted emergency response data;
      simulating a receiver for the emergency action data, wherein the simulation of the receiver is performed by the simulated base station;
      detecting at least one transmission error associated with receipt of the emergency action data with respect to the simulation of the receiver and the at least one transmission error in at least one of the simulated transmission of the vehicle incident data to the telematics server and the receipt of the emergency response data, wherein the at least one transmission error comprises call drop, signal error, and non-conformance, of the simulated transmission of the vehicle incident data to the telematics server, of the receipt of the emergency response data, and of the receipt of the emergency action data with respect to the simulation of the receiver, with the regulatory norms of local authorities of a jurisdiction; and
      displaying the at least one transmission error.

6. The vehicle telematics simulation controller of claim 5, further comprising
   generating an error report based on transmission faults in at least one of the transmission of the emergency response data to the vehicle control unit, the receipt of the emergency action data from the at least one external server or the simulation of the receiver.

7. The vehicle telematics simulation controller of claim 5, wherein the one or more test cases comprise one or more predefined conditions.

8. The vehicle telematics simulation controller of claim 5, wherein the software defined radio comprises a hardware interface comprising a GNU radio for simulating a physical radio frequency signal based on the vehicle incident data.

9. A non-transitory computer-readable medium storing instructions for vehicle telematics testing, wherein upon execution of the instructions by one or more processors, the one or more processors perform operation comprising:
   simulating a physical radio network for transmission of a vehicle incident data, wherein the vehicle incident data is received based on one or more test cases, wherein the physical radio network comprises at least one of a software defined radio and a simulated base station, and wherein the one or more test cases are generated in conformance with regulatory norms of local authorities of a jurisdiction;

forwarding the simulated transmission of the vehicle incident data to a telematics server;

receiving an emergency response data from the telematics server, in response to the forwarded simulated transmission of the vehicle incident data;

transmitting the emergency response data to a vehicle control unit;

receiving an emergency action data from the vehicle control unit in response to the transmitted emergency response data;

simulating a receiver for the emergency action data, wherein the simulation of the receiver is performed by the simulated base station;

detecting at least one transmission error associated with receipt of the emergency action data with respect to the simulation of the receiver and the at least one transmission error in at least one of the simulated transmission of the vehicle incident data to the telematics server and the receipt of the emergency response data, wherein the at least one transmission error comprises call drop, signal error, and non-conformance, of the simulated transmission of the vehicle incident data to the telematics server, of the receipt of the emergency response data, and of the receipt of the emergency action data with respect to the simulation of the receiver, with the regulatory norms of local authorities of a jurisdiction; and displaying the at least one transmission error.

10. The medium of claim 9, further comprising generating an error report based on transmission faults in at least one of the transmission of the emergency response data to the vehicle control unit, the receipt of the emergency action data from the at least one external server or the simulation of the receiver.

11. The medium of claim 9 wherein the one or more test cases comprise one or more predefined conditions.

12. The medium of claim 9, wherein the software defined radio comprises a hardware interface comprising a GNU radio for simulating a physical radio frequency signal based on the vehicle incident data.

* * * * *